United States Patent [19]

Maytum

[11] Patent Number: 5,623,215
[45] Date of Patent: Apr. 22, 1997

[54] TESTING OF SEMICONDUCTOR DEVICES

[75] Inventor: Michael J. Maytum, Bedford, England

[73] Assignee: Texas Instruments Incorporated, Dallas, Tex.

[21] Appl. No.: 646,469

[22] Filed: May 8, 1996

Related U.S. Application Data

[63] Continuation of Ser. No. 353,484, Dec. 9, 1994, abandoned.

[30] Foreign Application Priority Data

Dec. 10, 1993 [GB] United Kingdom ............... 9325281

[51] Int. Cl.$^6$ ............................................. G01R 31/26
[52] U.S. Cl. .......................................................... 324/765
[58] Field of Search ............................ 324/765; 365/201

[56] References Cited

U.S. PATENT DOCUMENTS

| | | | |
|---|---|---|---|
| 3,659,199 | 4/1972 | Knutson | 324/158 D |
| 3,895,297 | 7/1975 | Jarl | 324/158 T |
| 3,904,962 | 9/1975 | Olson, Jr. | 324/158 D |
| 3,979,672 | 9/1976 | Arnoldi | 324/158 T |
| 4,056,776 | 11/1977 | Olsson et al. | 324/158 SC |
| 4,307,342 | 12/1981 | Peterson | 324/158 D |
| 4,483,629 | 11/1984 | Schwarz et al. | 374/57 |
| 4,739,258 | 4/1988 | Schwarz | 324/537 |
| 5,285,151 | 2/1994 | Akama et al. | 324/765 |
| 5,406,212 | 4/1995 | Hashinaga et al. | 324/765 |
| 5,414,370 | 5/1995 | Hashinaga et al. | 324/765 |

FOREIGN PATENT DOCUMENTS

| | | | |
|---|---|---|---|
| 0275094 | 1/1988 | European Pat. Off. | G01R 31/28 |
| 3832273 | 9/1988 | Germany | G01N 27/18 |
| 4208146 | 3/1992 | Germany | G01R 31/26 |
| 54-095190 | 7/1979 | Japan . | |

OTHER PUBLICATIONS

1990 IEEE Int. Symp. Electromagnetic Compatibility, W. Boxleitner et al, "Characterizing the Stress Applied to Ics by Different ESD Tester Circuits", Aug. 1990 US, pp. 258–264.

1990 IEEE Int. Symp. Electromagnetic Compatibility, P. Richman, "Testing Transient Voltage Surge Suppressors", Aug. 1990, pp. 134–141.

Hewlett–Packard Journal, C. H. Diaz, "Automation of Electrical Overstress Characterization for Semiconductor Devices", vol. 45, No. 5, Oct. 1994, Palo Alto, US, pp. 106–111.

Elektronik, A. Pshaenich, "Kuhlen Kopf Bewahren", vol. 42, No. 3, Feb. 1993, Munchen De, pp. 78–89.

1993 Proceedings 43rd Electronic Components & Technology Conference, V. Patel et al, "Transient Thermal Impedance Tester for Power IC Packages", Jun. 1993, pp. 289–294.

Primary Examiner—Ernest F. Karlsen
Assistant Examiner—Russell M. Kobert
Attorney, Agent, or Firm—William B. Kempler; Richard L. Donaldson

[57] ABSTRACT

A method and an apparatus for testing semiconductor devices, especially overvoltage protectors, involves the application to the device to be tested of a standard surge waveform which is truncated by terminating it early. The amount of heating of the device by the truncated surge waveform is ascertained by monitoring or measuring a heat sensitive parameter of the device during and/or shortly after the application of the waveform. Devices which undergo less heating are capable of withstanding higher electrical loads in service than those which become more heated. The early termination is effected by a controllable short circuit operating on the standard waveform. The differential coefficient with respect to time of a heat sensitive parameter may be monitored continually during the truncated waveform and used to operate the short circuit even earlier if the differential coefficient exceeds a threshold value indicating an undue temperature rise in the device.

20 Claims, 3 Drawing Sheets

TESTING OF SEMICONDUCTOR DEVICES

This application is a Continuation of application Ser. No. 08/353,484, filed Dec. 9, 1994, now abandoned.

The present invention relates to the testing of semiconductor devices, and especially to testing them to establish the conditions under which they would fail.

Previously, semiconductor devices have been tested for their ability to withstand large signals applied to them by measuring some characteristic of the device, applying a standard test signal to the device (for example, a CCITT K17 or IEEE PC62 surge waveforms) and then measuring the characteristic again. The device is considered to be a failure if the characteristic has been changed significantly by the application of the test signal. The change in the characteristic will of course be especially marked if the device has been damaged by the test signal.

A disadvantage of that form of test is that the results are not reliable. For example, a device that reached an abnormally high temperature while the test signal was applied might show no, or have a only a small, change in the measured characteristic after application of the test signal, which would be taken as indicating a good device, whereas, in fact, the high temperature reached may have melted the contact metallisation of the device, thereby changing the connections to it so as to leave only a small area of contact. Such a device would be likely to fail early in service.

Another disadvantage of the test described above is that devices that are weak will be damaged or destroyed by the test. Some of those devices might otherwise have been suitable for use under less demanding conditions than those expected for devices that passed the test.

It is an object of the present invention to provide a method of testing a semiconductor device that provides a more reliable indication of the serviceability of the device and does not automatically result in damage to or destruction of a device that is not up to the required standard.

The invention provides a method of testing a semiconductor device, which comprises applying a test electrical signal to the device, which signal results in a current flow within the device that is within the operating limits of the device, and measuring the value of a temperature-dependent parameter of the device to obtain an indication of the increase in temperature of the device resulting from the application to it of the test electrical signal.

Whereas, in the previously known testing method, which is described above, a device will fail only when the application of a test signal once has sufficed to change measurably an operating characteristic of the device, in the method of the invention, a device will fail if the application of a test signal once has caused a temperature rise that is unacceptable because, for example, if it were to be repeated frequently, it would result in failure of the device.

It will be appreciated that the application of a current-generating test signal may require the application of an initial signal, for example, a higher voltage that serves to render the device conducting. Further, a plurality of test signals may be applied.

The test electrical signal may have two or more distinct components in succession. Where the device under test has three or more terminals signals additional to the test electrical signal may be applied to the device to establish its conductive state.

The semiconductor device may be an over-voltage protector which in operation switches to a low impedance state when the voltage applied to it exceeds a threshold level.

The test signal may be such that a semiconductor device of the type being tested that does not have the full performance expected of it is not damaged thermally by the signal. For example, the test signal may be of especially short duration.

Termination of the test signal may be effected by short-circuiting of the device under test.

When the semiconductor device is of silicon, the test signal may be such that, when it terminates, the semiconductor device will have reached a highest local temperature within the range of from 100° C. to 300° C., and preferably within the range of from 190° C. to 210° C.

If the device under test is an overvoltage protector, the temperature dependent parameter measured may be the zener voltage of the device. Instead, it may be the leakage current of the device.

A goodness factor of the device under test may be obtained by calculating the value of at least one temperature dependent parameter at the instant of termination of the test signal from values of that parameter measured after that instant.

If the semiconductor device is one that switches to a low impedance state when a high voltage is applied to it, like an overvoltage protector, the test signal may be provided by two waveforms applied one after the other to the device, the first waveform having a high voltage and a low current, which drives the device to change to a low impedance state, and the second waveform having a low voltage and a high current, which serves to maintain the device in its low impedance state.

The method of testing the semiconductor device may further include monitoring the value of a temperature dependent parameter as it changes during the application of the test signal and terminating the signal when the change in the parameter indicates that the device is about to be damaged by the test signal.

The monitoring of the value of the parameter may take place during a portion of the duration of the operating signal throughout which the magnitude of the signal is substantially constant. If the device is switched to a low impedance state, the parameter monitored may be the voltage across the device when it is in that low impedance state.

The monitoring may take the form of monitoring the differential coefficient with respect to time of the temperature dependent parameter, and the test signal may be terminated when the rate of change of the parameter (in a direction indicating rising temperature) exceeds some predetermined value.

A method of testing semiconductor devices will now be described, by way of example only, with reference to the accompanying drawings of which:

Figure 1:
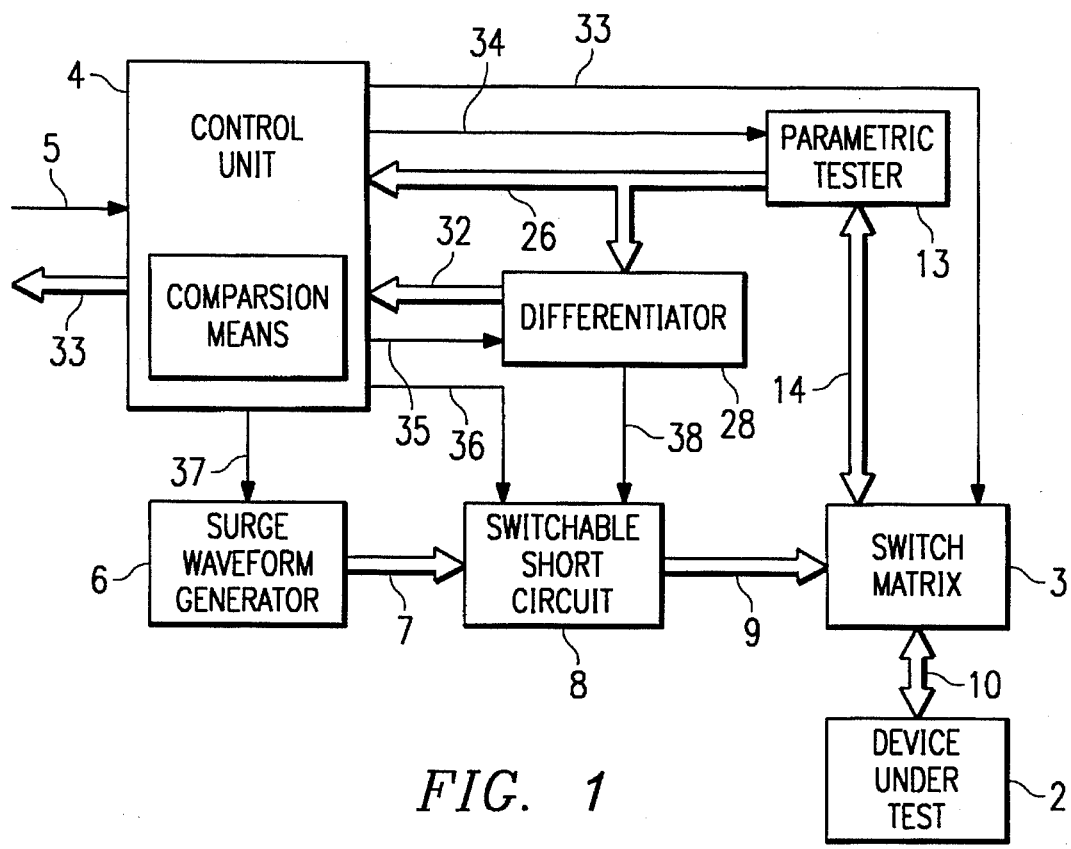
FIG. 1 is a block diagram of apparatus for performing the method of testing semiconductor devices.

FIG. 1 shows in block diagrammatic form an example of apparatus for performing a method according to the invention. In the diagram the conductors carrying signals between the various blocks of the apparatus are represented by thin lines and thick lines. The thin lines represent the conductors that carry control signals and thick lines those that carry other types of signals. Each line may represent several separate conductors carrying different signals between the components represented by the blocks.

A control unit 4 coordinates the operation of the apparatus by issuing control signals along conductors 33, 34, 35, 36, 37 to all the other blocks except a device under test 2. The terminals of the device under test 2 are connected to a switch matrix 3 via conductors 10. The switch matrix 3 operates under the direction of the control unit 4, to connect particular ones of the conductors 10 to particular ones of conductors 9 and 14. The conductors 14 lead from the switch matrix 3 to a parametric tester 13 and the conductors 9 lead from the switch matrix to a switchable short circuit 8. Conductors 7, which correspond respectively to the conductors 9, receive the output of a surge waveform generator 6 and apply it to the switchable short circuit 8. The switchable short circuit operates in response to a control signal from either the control unit 4 or from a differentiator 28 carried on conductors 36 or 38 respectively, to provide short circuits between various of the conductors 7 or 9, so as to terminate quickly a signal or signals applied through the switch matrix 3 to the device under test 2.

The parametric tester 13 supplies test currents and/or voltages to the device under test 2 and receives from it electrical signals dependent on the value of a temperature dependent parameter of the device 2 or on the values of several such parameters. The values are measured by the parametric tester 13 and the measurements are supplied to the differentiator 28 and the control unit 4 along conductors 26. The differentiator supplies a signal to the control unit 4 along conductors 32 when the measured value of a temperature dependent parameter of the device 2 indicates that the device is suddenly getting hotter.

The control unit 4 receives control signals from an operator or a process controlling computer (not shown), for example, along conductors 5 to initiate a test and supplies the results of the test along conductors 38.

For the purpose of this description the example of a semiconductor device 2 chosen is an overvoltage protector and some details of the test to be described are specific to such a device. Overvoltage protectors are tested to see whether they can withstand a particular electrical surge. As a reaction to that surge the devices become hot; poor devices that are likely to fail in service become hotter than good devices. In extreme cases, very poor devices can be destroyed by melting internally when the surge is applied to them. In less extreme cases the heating of the devices can result in diffusion of the dopants within the semiconductor which degrades the performance of the devices progressively and leads ultimately to their destruction. Those processes are greatly accelerated in devices which become heated to a greater extent in response to the signals normally applied to them and such devices are more likely to fail early in service.

It follows that the temperature reached by a device at the end of a standard electrical surge signal can provide an indication of its likely performance in service and the invention makes use of that fact. That is especially applicable to devices that, in use, carry large currents because they can be at a high, but not necessarily damaging, temperature for long periods of time.

The test performed by the apparatus shown in FIG. 1 proceeds in the following manner. Once the device 2 to be tested is connected to the switch matrix 3 and the control unit 4 receives an instruction over the line 5 to begin the test, the control unit 4 causes the surge waveform generator 6 to produce an electrical surge which is applied to the device 2 via the lines 7, the switchable short circuit 8, the lines 9, the switch matrix 3 and the lines 10. The switchable short circuit is not active at this time so that the surge on the lines 7 is transmitted to the lines 9 and on to the device 2.

Figure 2:
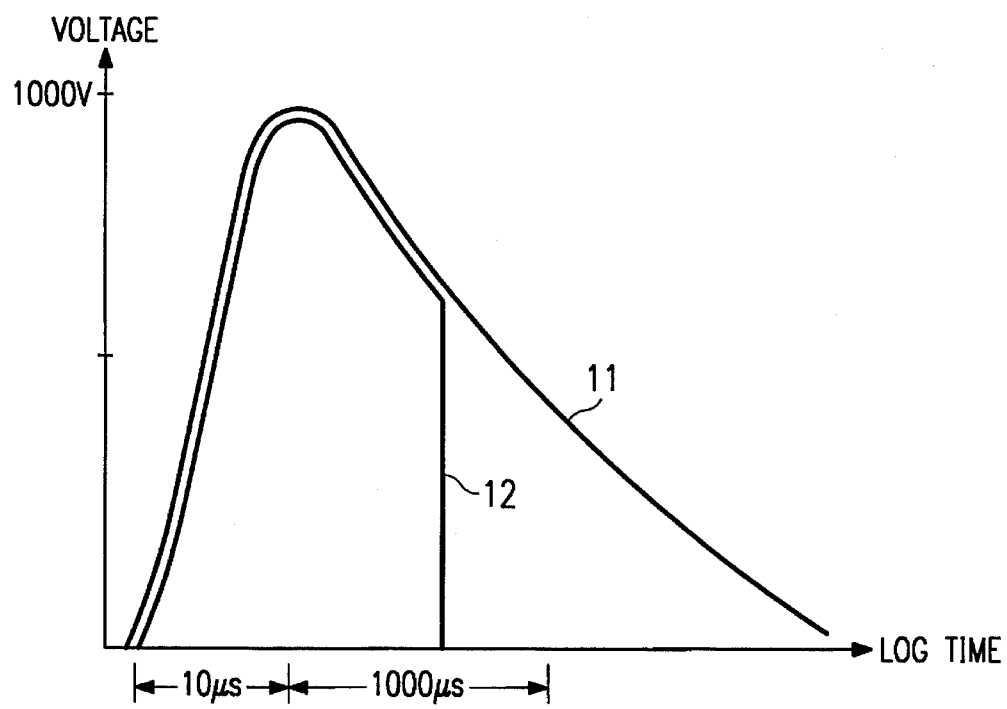
FIG. 2 is a diagram of the waveform of a voltage surge used to test a semiconductor overvoltage protector.

A standard surge waveform for testing overvoltage protectors conforms to the IEEE PC62 standard. That surge waveform is shown in FIG. 2 and rises in 10 µs to a peak voltage and current of 1000 V and 100 A and then falls to 50% of the peak values in 1000 µs. The disadvantages of applying such a waveform to the device have been mentioned above: substandard devices are destroyed and the results are not a reliable indication of the quality of the device.

The apparatus reduces the stress applied to the device under test by truncating the standard surge waveform using the switchable short circuit 8 so as to reduce or eliminate damage done by the surge to the device under test, if the device is substandard. The resulting truncated waveform applied to the device under test 2 is shown at 12 in FIG. 2. Other waveforms that impose less stress than the standard surge on the device under test could be used, but the truncated waveform 12 just described has the advantages that equipment already exists to produce the specialised waveform and that the truncated waveform 12 has a simple relationship to the standard waveform 11 thereby making it easier to determine the relationship between the standard test and the test performed by the apparatus of the invention.

The method of testing ascertains how the device responds to the surge waveform applied to it, by finding out to what extent the device is heated by the current passed through it. Because semiconductor devices have small thermal masses and the surge waveform signals applied to the devices are of short duration, it is impracticable to measure their temperatures directly. However, semiconductors have temperature-dependent parameters that can be measured quickly and easily by electrical methods. Data relating to the performance of the device in service can be derived from the measurement of the temperature-dependent parameter made during the application of the test waveform to the device or shortly thereafter while the device is still hot from that application.

It is preferable that the application of the surge waveform heats the devices to a point where the parameter measured is especially sensitive to temperature, enabling smaller differences between the performance of different devices to be discerned by the test. In cases where the parameter is measured after the application of the surge waveform to the device, the device should be heated sufficiently by the waveform for the parameter still to be in the especially sensitive range when the measurement is made.

Apart from the amount of heating of the device, it is necessary to consider some other factors when deciding how much stress the surge waveform should apply to the device; in the present example the decision to be made is when to truncate the standard surge waveform. One factor is the thermal damage to the device; in silicon devices the first failure mechanism to occur as the temperature rises is usually the alloying of aluminium conductor layers with the silicon which takes place at a temperature of 500° C. Therefore, that temperature should not be exceeded. At a temperature above 300° C., in silicon devices having usual dopant concentrations, conduction is dominated by thermally generated carriers. That means that the characteristics of the device that depend on junctions are swamped by those carriers and the device behaves in a purely resistive manner, which causes difficulties in measuring parameters dependent on those characteristics. The resistance of the device in that state could itself apparently be used as a measure of the temperature of the device, but the heating is not uniform throughout the device and only parts of the active regions become resistive. As a result, the resistance of a device is strongly dependent on its geometry so that it is difficult to get an accurate temperature measurement from it. Allowances for the geometry could be made in particular instances if the resistance as a function of temperature were established for each geometry, for example by measuring the cooling curve of resistance.

Figure 3:
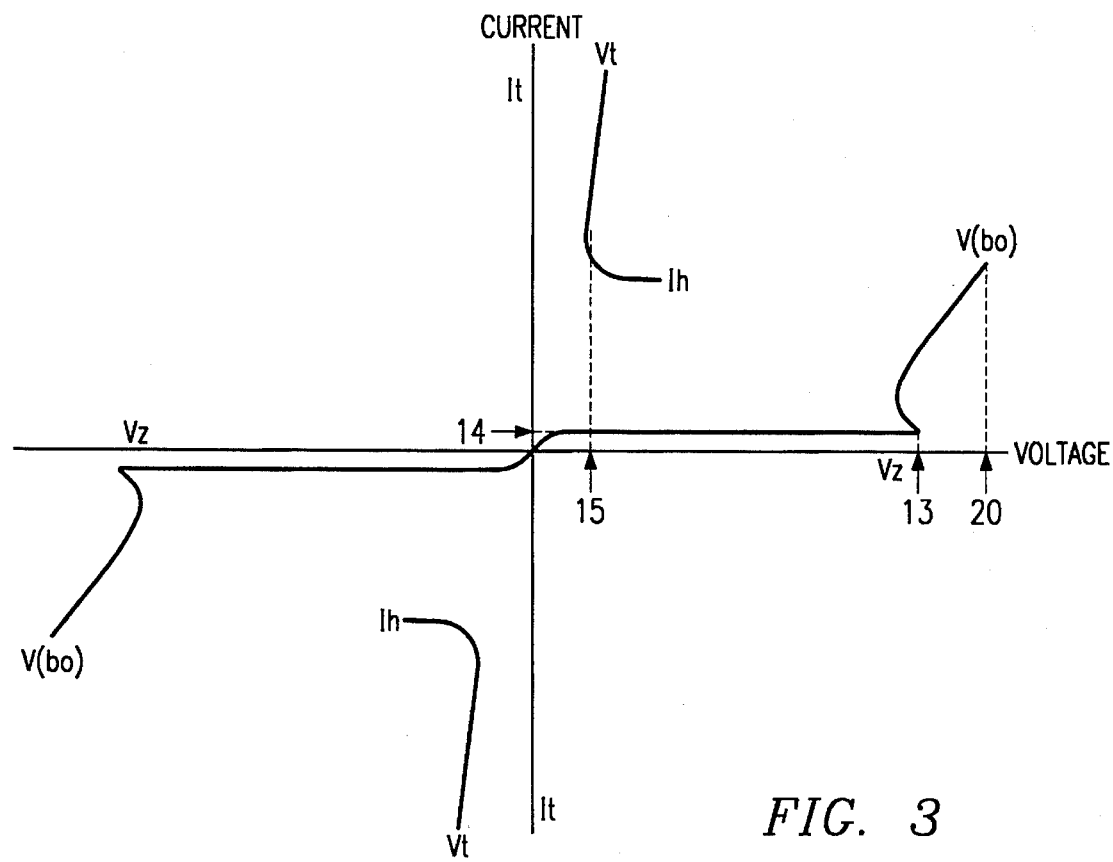
FIG. 3 shows the current/voltage characteristic of a typical semiconductor overvoltage protector.

Another temperature-dependent parameter of overvoltage protector devices that could be used is the zener voltage, because it is a well-defined and sensitive function of temperature. FIG. 3 shows the voltage/current characteristic of a typical overvoltage protector. The zener voltage of the device is indicated at 13. That parameter is influenced by the effects of thermal carriers at temperatures above 300° C., so that the optimum value for the maximum temperature of the device taking the other factors into account is 200° C.

Another parameter that could be used is the leakage current of the device, which is indicated at 14 in FIG. 3. At temperatures below 70° C., that current is dominated by the junction leakage which has a large temperature coefficient, but at temperatures above 70° C. the dominant current is the surface current which has a small temperature coefficient. As a result, that parameter is less suitable than the zener voltage for ascertaining the temperature of the device after the surge has been applied to it.

A further possibility for the temperature-dependent parameter is the voltage across the device when it is in its low impedance state, that is to say, the on-voltage. That is shown at 15 in FIG. 3 and its value is largely independent of the current passed.

In the apparatus shown in FIG. 1, it is the parametric tester 13 that is used to measure the temperature-dependent parameters. The tester 13 is connected to the device under test 2 via lines 14 and the switch matrix 3. The operation of the tester 13 will depend on which temperature dependent parameter of the device is to be measured. One way in which the tester 13 could work is by passively measuring the voltage across the terminals of the device to which the surge waveform is applied, either during the surge waveform or soon afterwards while the device is still hot. Alternatively the tester 13 could measure the response to another signal small enough not to cause significant additional heating of the device after the surge waveform has ended. From the above discussion it will be understood that the zener voltage is the preferred temperature dependent parameter for measurement when testing an overvoltage protector. Overvoltage protectors are two terminal devices and it is therefore impossible to bring the device actively to the point on the current voltage characteristic (FIG. 3) where the zener voltage can be measured directly without interfering with another signal, for example, the surge test waveform applied to the device. For that reason the zener voltage is measured shortly after the end of the surge test waveform. Generally, it is not desirable to apply a current from the parametric tester to the same terminals as those to which the surge test waveform is applied while that waveform is being applied.

The zener voltage is measured by passing a current of 1 mA through the device from the parametric tester 13 to the device by the switch matrix (3) when the truncated surge waveform ends.

Figure 4:
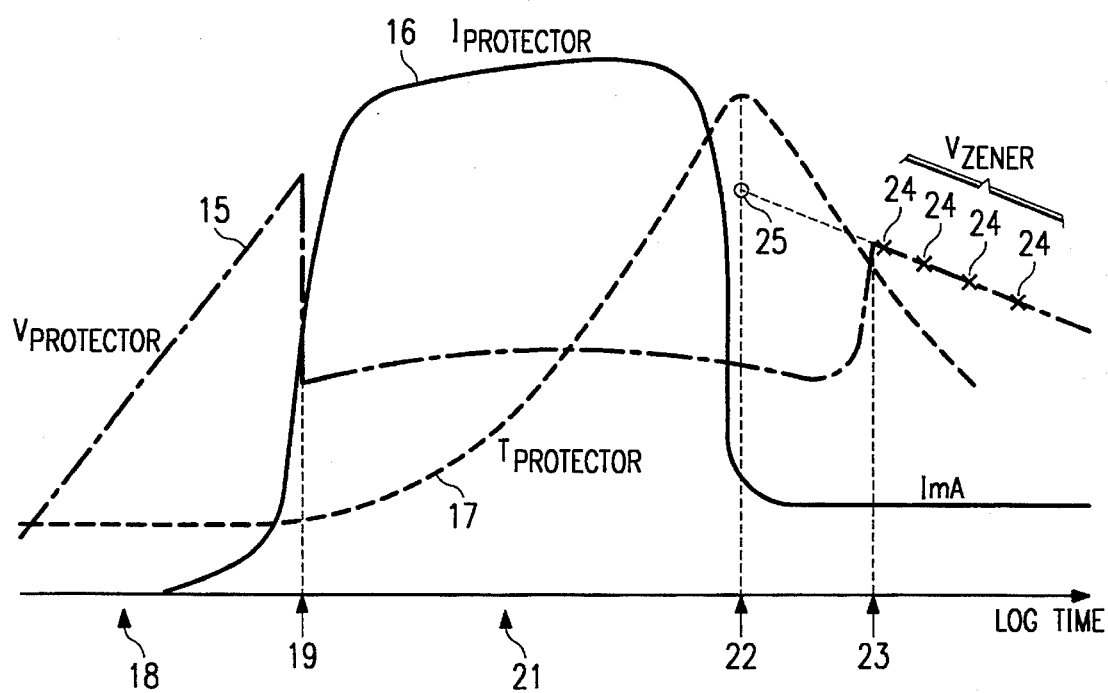
FIG. 4 is a diagram of the variation of several parameters of an overvoltage protection device during or soon after the application of a test waveform.

FIG. 4 shows the plots against a logarithmic scale of time, of the waveform of the voltage across the protector at 15, of the waveform of the current through the protector at 16, and of the temperature of the protector as the test proceeds at 17. During the period 18 soon after the start of the surge waveform the overvoltage protector passes little current and the voltage across it matches the rising internal voltage of the surge waveform generator 6. At the time instant 19 the breakdown voltage, indicated by the reference 20 in FIG. 3, is reached and the overvoltage protector switches to its low impedance state in which it remains throughout the period 21 until the truncated surge waveform ends at time instant 22. At that time the device under test 2 receives from the parametric tester 13 current allowing the device 2 to switch back to its high impedance state which it does at the time instant 23. At that time the voltage across the device is its zener voltage. Measurements (24) of the zener voltage are now made by the parametric tester 13. A suitable value for comparison of one device with another is the value of the zener voltage at the end of the surge waveform; that is at point 25 in FIG. 4. Although, for the reasons explained above, that measurement cannot be taken directly, it can be calculated by extrapolation backwards in time from the measured values at the points 24. The calculation can be performed by the control unit 4 (see FIG. 1) which receives the measurements from the parametric tester 13 via the lines 26.

Figure 5:
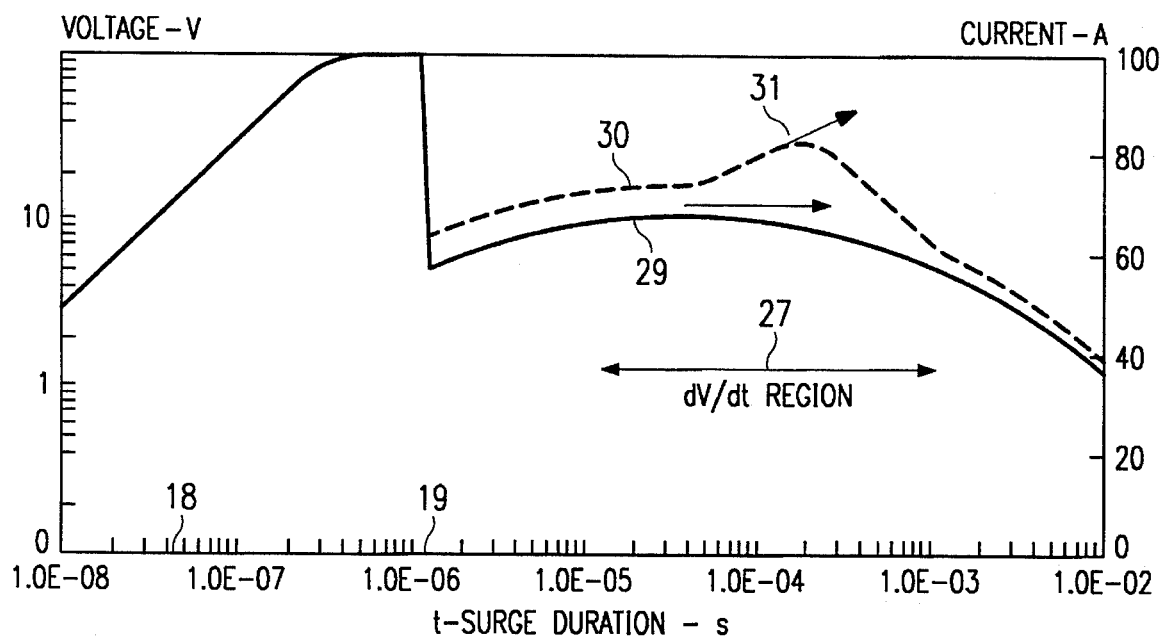
FIG. 5 is a diagram illustrating a method of protecting a semiconductor device during a test.
Figure 6:
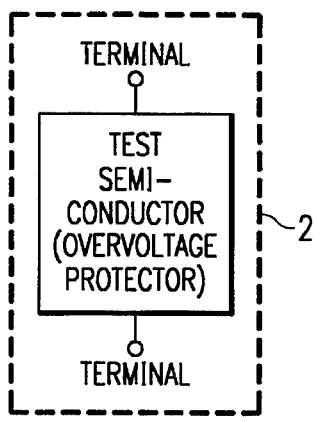
FIG. 6 shows details of the Device Under Test shown in FIG. 1.

A further feature of the apparatus of FIG. 1 is that the device under test 2 can be monitored during the application of the surge waveform to determine if it is about to fail, which is still a possibility even though the standard surge waveform is truncated so that it produces lower stress on the device than would the standard test waveform. Referring to FIG. 5, for a period 27 during the time when the overvoltage protector 2, is in its low voltage state, the control unit 4 enables the differentiator 28 to receive values from the parametric tester 13, which in this instance is set up to monitor the voltage across the overvoltage protector 2, that is to say, the values are of the "on" voltage. The differentiator 28 calculates from the values it receives a series of values of the differential coefficient with respect to time of the "on" voltage. The behaviour of normal devices is illustrated by the plot 29 in FIG. 5. During the period 27, the gradient of the "on" voltage as shown in the plot 29 is always less than a small positive value. A second plot 30 shows the behaviour of a device that is about to fail; its temperature begins to rise rapidly as it approaches failure, that rise in temperature being shown by rapid rise in the "on" voltage. The differentiator 28 detects the large positive value of the differential coefficient at time 31 and transmits a control signal to the switchable short circuit 8 to operate it and thereby terminate the surge waveform. The control unit 4 receives from the differentiator 28 an indication of the incipient failure of the device via the lines 32.

If a rectangular current pulse were to be used as the surge waveform in place of that shown in FIG. 2, the detection of the incipient failure of a device being tested would be improved. The constant current would mean that the voltage drop across a normal device would be constant, so that a contribution to the differential coefficient of the "on"-voltage that would otherwise be present is removed and the only change in voltage across the device would be that resulting from its high temperature. Such a probe would also give a greater spread in maximum temperatures of the devices being tested compared to other pulses of similar magnitude, making the test more sensitive, because more power is dissipated in a device at higher currents. A rectangular pulse would, however, make the test harder to relate to the existing standard test using the surge waveform shown in FIG. 2.

Referring again to the apparatus of FIG. 1, when the control unit has received the zener voltage measurements and has calculated the zener voltage at the end of the surge waveform or has received a signal from the diffentiator indicating that the device is about to fail, the control unit produces an output on conductors 33 giving the result of the test.

I claim:

1. A method of testing a semiconductor device, comprising the steps of:

during a first period, applying a thermal stress test electrical signal to the semiconductor device tending to heat it towards destruction;

truncating the thermal stress test electrical signal at a predetermined truncation time $t_T$ selected to substantially thermally stress the semiconductor device but avoid permanent damage to it if well made as designed;

during a cooling period beginning at the truncation time $t_T$, applying a measuring waveform to the semiconductor (i) for inducing a time-changing, temperature-dependent parameter signal indicating the semiconductor's instantaneous temperature at successive times ($t_1$, $t_2$, $t_3$, ...) shortly after the truncation time $t_T$, and (ii) for sampling the parameter signal to obtain parameter samples ($p(t_1)$, $p(t_2)$, $p(t_3)$, ...) at such successive times;

extrapolating backwards in time from the parameter samples ($p(t_1)$, $p(t_2)$, $p(t_3)$, ...) to obtain the value of an estimated parameter signal $p(t_T)$ at the truncation time $t_T$;

generating a "passed" signal only if the estimated parameter signal $p(t_T)$ indicates a semiconductor device temperature less than a predetermined no-pass temperature indicating incipient failure of the semiconductor device.

2. A method according to claim 1 wherein the semiconductor device is a two-terminal device and is such that in operation it exhibits breakdown to a low impedance state in response to the test electrical signal.

3. A method according to claim 2 wherein the semiconductor device is an overvoltage protector.

4. A method according to claim 3 wherein the temperature dependent parameter is the zener voltage of the overvoltage protector.

5. A method according to claim 3 wherein the temperature dependent parameter is the leakage current of the overvoltage protector.

6. A method according to claim 2 wherein the test electrical signal comprises a first waveform having a high voltage and a low current followed by a second waveform having a low voltage and a high current, the first waveform causing the semiconductor device to exhibit breakdown to a low impedance state and the second waveform maintaining the device in the low impedance state.

7. A method according to claim 1 wherein the test electrical signal is of such duration and such maximum magnitude that a substandard device having a usable performance below that expected would not be thermally damaged thereby.

8. A method according to claim 7 wherein termination of the test electrical signal is determined by short-circuiting the signal.

9. A method according to claim 1 wherein the semiconductor of the device is silicon and the test electrical signal is such that a device having the performance expected reaches a temperature of between 100° C. and 300° C. immediately following the application of the test electrical signal thereto.

10. A method according to claim 9 wherein the test electrical signal is such that a device having the performance expected reaches a temperature of between 190°–210° C. following the application of the test electrical signal thereto.

11. A method according to claim 1 wherein the derivation of the performance data includes calculating the value of a temperature dependent parameter for a time instant at the end of the application of the test electrical signal to the device from values of that parameter measured after that instant.

12. A method according to claim 1 including monitoring the value of a temperature dependent parameter of the device during the application of the test electrical signal to the device, and removing the test electrical signal if the value of the parameter indicates that the device is becoming heated excessively.

13. A method according to claim 12 wherein the voltage of the test electrical signal is substantially constant of a period of time, and the monitoring of the value of a temperature dependent parameter is performed during that period.

14. A method according to claim 12 wherein the device is a two-terminal device which exhibits breakdown to a low impedance state and the parameter monitored is the voltage across the device in its low impedance state.

15. A method according to claim 1 wherein the sampling of the temperature-dependent parameter includes deriving the differential coefficient with respect to time of the parameter and detecting the truncation time $t_T$ as when the value of the differential coefficient exceeds a threshold rapid rise value.

16. Apparatus for testing a semiconductor device, comprising:

terminals for connection to a semiconductor device to be tested, a signal generator, a parametric tester, and means for controlling the signal generator and the parametric tester so that in operation the signal generator applies a thermal stress test electrical signal to the terminals, which signal is such as to cause a current flow within the device that is within its operating limits during a predetermined nondestructive heating period, and the parametric tester is connected to the terminals during a cooling period immediately following the heating period so as to sample a value of a temperature-dependent parameter of the device and backwards time extrapolate an indication of the increase in temperature of the device resulting from the application to it of the test electrical signal when the heating period ends.

17. Apparatus according to claim 16 wherein the signal generator includes means for generating a standard waveform for surge testing semiconductor devices, and means truncating that waveform.

18. Apparatus according to claim 17 wherein the means for truncating the waveform comprises a switchable short circuit which is connected in the electrical path from the generating means to the terminals and is operated at a predetermined instant during the generation of the standard waveform to short circuit the output of the generating means and terminate the electrical test signal applied to the device.

19. Apparatus according to claim 17 further including means for deriving from the device during the application of the test electrical signal to the device a signal indicating whether the device is becoming excessively heated, the driving means being connected to the truncating means to terminate the waveform applied to the device if the signal indicates that the device is becoming excessively heated.

20. Apparatus according to claim 19 wherein the means for deriving an indicating signal includes differentiating means for deriving an approximate value of the differential coefficient with respect to time of the temperature dependent parameter and, comparison means for determining whether the differential coefficient exceeds a threshold value, the signal indicating excessive heating if the differential coefficient exceeds the threshold value.

* * * * *